(12) United States Patent
Isik et al.

(10) Patent No.: US 7,741,897 B1
(45) Date of Patent: Jun. 22, 2010

(54) METHOD AND APPARATUS FOR SELF GATE PUMPED NMOS HIGH SPEED SWITCH

(75) Inventors: Tacettin Isik, Saratoga, CA (US); Siyou Weng, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/129,545

(22) Filed: May 29, 2008

(51) Int. Cl.
*H03K 17/687* (2006.01)
(52) U.S. Cl. .................................. 327/434; 324/382
(58) Field of Classification Search ................. 327/427, 327/434, 536, 589, 403, 404, 376, 377, 382
See application file for complete search history.

(56) References Cited

U.S. PATENT DOCUMENTS

| | | | | |
|---|---|---|---|---|
| 5,233,237 | A | * | 8/1993 | Ohannes et al. ............. 326/27 |
| 5,886,563 | A | * | 3/1999 | Nasila ...................... 327/423 |
| 6,380,976 | B1 | * | 4/2002 | Borg ........................ 348/308 |

* cited by examiner

*Primary Examiner*—Long Nguyen
*Assistant Examiner*—Sibin Chen
(74) *Attorney, Agent, or Firm*—Heimlich Law, PC; Alan Heimlich, Esq.

(57) ABSTRACT

A method and apparatus for self gate pumped NMOS high speed switch have been disclosed.

2 Claims, 6 Drawing Sheets

```
                                    ┌─ 700
┌─────────────────────────┐
│ Use a first MOS transistor as a │
│ switch between a source of said │  702
│ first MOS transistor and a drain of │
│ said first MOS transistor.      │
└─────────────────────────┘

┌─────────────────────────┐
                    │ Use a third MOS transistor │
                    │ connected to a second supply │
           704      │ voltage and said gate of said first │
                    │ MOS to bias said gate of said first │
                    │           MOS.          │
                    └─────────────────────────┘

┌─────────────────────────┐
               │ Use a second MOS transistor │
               │ connected to a first supply voltage │
               │ and a diode to bias a gate of said │  706
               │      first MOS transistor. │
               └─────────────────────────┘
```

METHOD AND APPARATUS FOR SELF GATE PUMPED NMOS HIGH SPEED SWITCH

FIELD OF THE INVENTION

The present invention pertains to electronic switches. More particularly, the present invention relates to a method and apparatus for self gate pumped NMOS high speed switch.

BACKGROUND OF THE INVENTION

Figure 3:
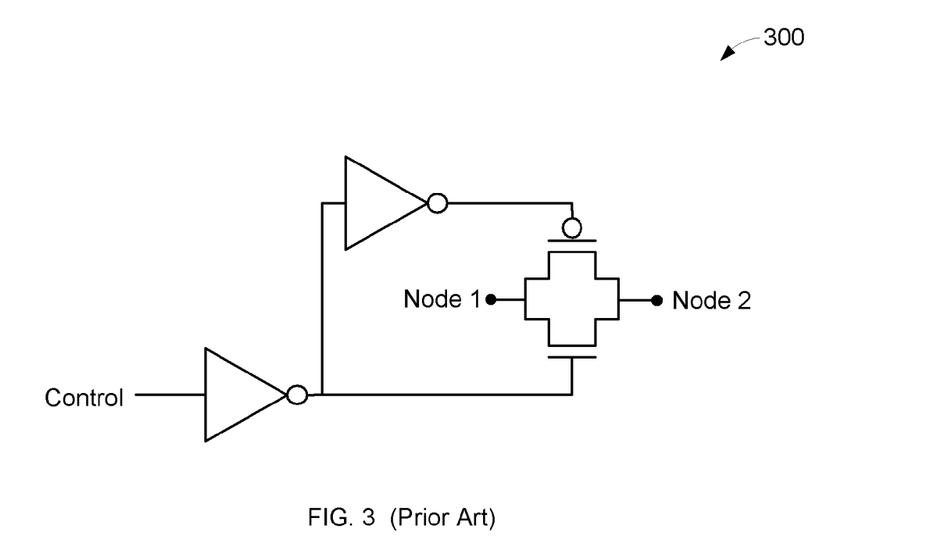
FIG. 3 illustrates a PMOS-NMOS switch.
Figure 4:
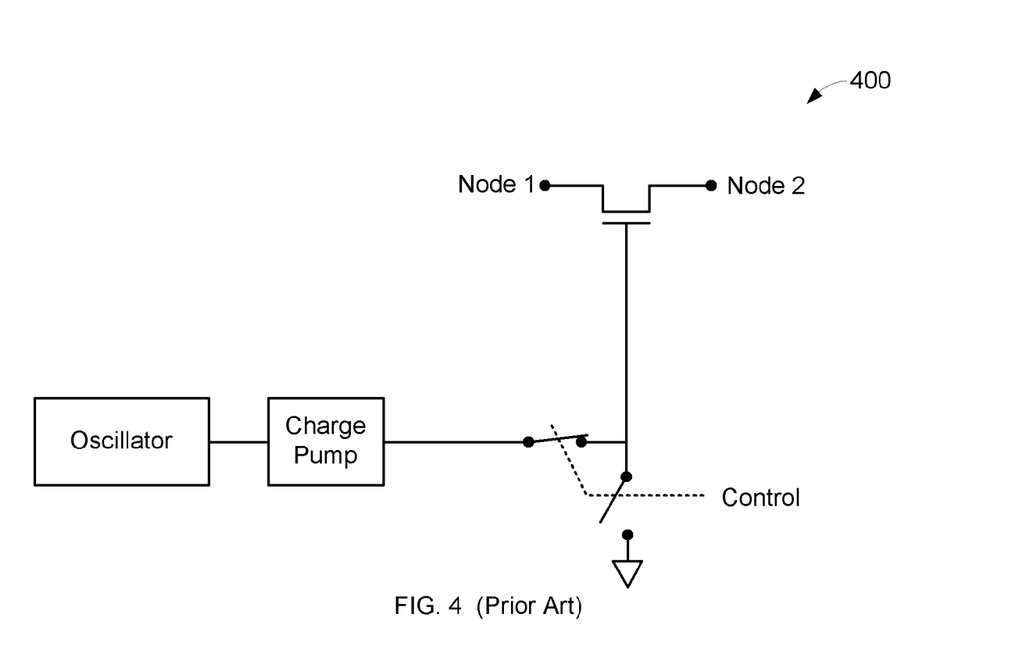
FIG. 4 illustrates actively pumping the gate voltage of an NMOS transistor.

In order to isolate two electrical nodes or connect them together, switches are used. Electronic solid state switches are replacing the mechanical switches for many functions. A popular type of solid state switch is a PMOS-NMOS combination which requires little circuitry to drive the gate voltage and performs reasonably well within certain limits. See FIG. 3. Problems arise when one tries to use PMOS-NMOS switches at high frequencies (e.g. above 100 MHz). Due to the significant parasitic junction and gate oxide capacitance, it has been a challenge to build a low ON resistance switch operating at such frequencies. One approach to the problem has been to remove lower performing PMOS transistors and pump the gate voltage of an NMOS transistor to compensate for the absence of PMOS. See FIG. 4. Pumping the gate voltage however, requires complicated circuits which may include oscillators, charge pumps, etc. that will add unwanted power consumption and noise to the product. This may present a problem.

BRIEF DESCRIPTION OF THE DRAWINGS

The invention is illustrated by way of example and not limitation in the figures of the accompanying drawings in which.

SUMMARY OF THE INVENTION

Applicant(s) hereby submit that this Summary of the Invention complies with applicable CN (China i.e. SIPO) standards. All claims are literally copied here.

1. A method comprising:
   using a first MOS transistor as a switch between a source of said first MOS transistor and a drain of said first MOS transistor;
   using a second MOS transistor connected to a first supply voltage and a diode to bias a gate of said first MOS transistor; and
   using a third MOS transistor connected to a second supply voltage and said gate of said first MOS to bias said gate of said first MOS.

2. The method of claim 1 further comprising:
   connecting a control to said second MOS transistor gate and to said third MOS transistor.

3. The method of claim 2 wherein said first MOS transistor is an NMOS transistor, said second MOS transistor is a PMOS transistor, and said third MOS transistor is an NMOS transistor.

4. The method of claim 3 wherein said first supply voltage is greater than said second supply voltage.

5. The method of claim 2 wherein said first MOS transistor is a PMOS transistor, said second MOS transistor is an NMOS transistor, and said third MOS transistor is a PMOS transistor.

6. The method of claim 5 wherein said first supply voltage is less than said second supply voltage.

7. An apparatus comprising:
   a first transistor having a gate, a source, and a drain, said source capable of being operatively coupled to an input, said drain capable of being operatively coupled to an output;
   a diode having an anode and a cathode, said cathode operatively coupled to said first transistor gate;
   a second transistor having a gate, a source, and a drain, said source capable of being operatively coupled to a first supply voltage, said drain operatively coupled to said diode anode; and
   a third transistor having a gate, a source, and a drain, said drain capable of being operatively coupled to said first transistor gate, said source capable of being operatively coupled to a second supply voltage, and said gate operatively coupled to said second transistor gate.

8. An apparatus comprising:
   a first transistor having a gate, a source, and a drain, said source capable of being operatively coupled to an input, said drain capable of being operatively coupled to an output;
   a diode having an anode and a cathode, said anode operatively coupled to said first transistor gate;
   a second transistor having a gate, a source, and a drain, said source capable of being operatively coupled to a second supply voltage, said drain operatively coupled to said diode cathode; and
   a third transistor having a gate, a source, and a drain, said drain capable of being operatively coupled to said first transistor gate, said source capable of being operatively coupled to a first supply voltage, and said gate operatively coupled to said second transistor gate.

9. An apparatus comprising:
   a first NMOS transistor having a gate, a source, and a drain, said source capable of being operatively coupled to an input, said drain capable of being operatively coupled to an output;
   a first diode having an anode and a cathode, said cathode operatively coupled to said first NMOS transistor gate;
   a first PMOS transistor having a gate, a source, and a drain, said source capable of being operatively coupled to a first supply voltage, said drain operatively coupled to said diode anode;
   a second NMOS transistor having a gate, a source, and a drain, said drain capable of being operatively coupled to said first NMOS transistor gate, said source capable of being operatively coupled to a second supply voltage, and said gate operatively coupled to said first PMOS transistor gate;
   a second PMOS first transistor having a gate, a source, and a drain, said source capable of being operatively coupled to said input, said drain capable of being operatively coupled to said output;
   a second diode having an anode and a cathode, said anode operatively coupled to said second PMOS transistor gate;

a third NMOS transistor having a gate, a source, and a drain, said source capable of being operatively coupled to said second supply voltage, said drain operatively coupled to said diode cathode; and a third PMOS transistor having a gate, a source, and a drain, said drain capable of being operatively coupled to said second PMOS transistor gate, said source capable of being operatively coupled to said first supply voltage, and said gate operatively coupled to said third NMOS transistor gate.

10. The apparatus of claim 9 further comprising:

a first inverter having an input and an output; said input capable of being operatively coupled to a control input; and said output operatively coupled to said third PMOS gate;

a second inverter having an input and an output, said input operatively coupled to said first inverter output, and said output operatively coupled to said second NMOS gate.

11. An apparatus comprising:

means for biasing a first transistor gate at substantially a first supply voltage minus a diode drop based on a control input in a first state; and means for biasing a second transistor gate at substantially a second supply voltage plus a diode drop based on said control input in said first state.

12. The apparatus of claim 11 further comprising:

means for biasing said first transistor gate at substantially said second supply voltage based on said control input in a second state; and means for biasing said second transistor gate at substantially said first supply voltage based on said control input in said second state.

DETAILED DESCRIPTION

In one embodiment of the invention, an NMOS transistor with a diode and a series transistor from a supply voltage source is tied to the NMOS transistor's gate. To turn the switch off, another transistor between the gate and the ground is used. Controlling the gate voltage of this drive transistor will either short the switch transistor's gate to the ground or let it be pulled to the supply voltage through the diode. When the gate is pulled up high to the supply voltage minus a diode voltage drop, further increase of this voltage will happen when a large signal occurs at the drain or source of the transistor.

With this arrangement the gate capacitance is utilized to help raise the voltage and eliminate the need for complicated charge pump circuitry. This technique, in one embodiment, also increases the bandwidth of the switch because it utilizes the gate capacitance which is otherwise considered to be a parasitic element. The techniques disclosed can easily be extended from the NMOS only configurations described below to, for example, PMOS-NMOS combinations.

Figure 5:
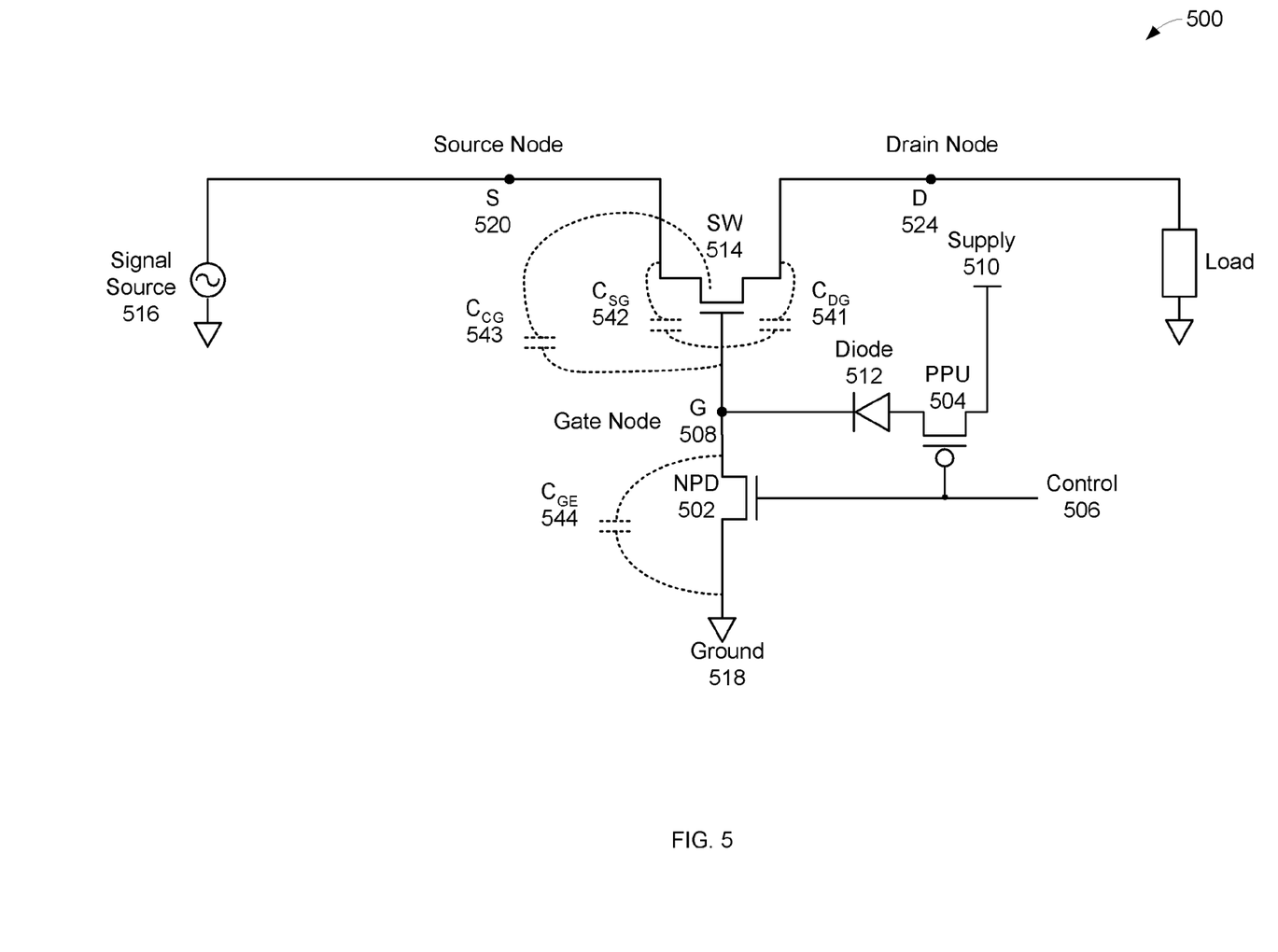
FIG. 5 illustrates one embodiment of the invention showing use of NMOS in the switch.

FIG. 5 illustrates, generally at 500, one embodiment of the invention. Capacitances associated with devices and/or the circuit are denoted 54X, where X=1 to 4, and as dashed entities. $C_{DG}$ 541 denotes the capacitance from transistor SW 514 drain to gate. $C_{SG}$ 542 denotes the capacitance from transistor SW 514 source to gate. $C_{CG}$ 543 denotes the capacitance from transistor SW 514 channel to gate. $C_{SE}$ 543 denotes the capacitance from transistor SW 514 gate to earth (Ground).

In one embodiment of the invention, operation is as follows. When transistor NPD 502 (N-PullDown) is turned off and transistor PPU 504 (P-PullUp) is on by applying a low voltage to Control 506, node G 508 (Gate Node) will move to the Supply 510 voltage minus a diode drop (from Diode 512) quickly. That is, node G 508, absent any signal source input (e.g. Signal Source 516), is biased at a voltage substantially equal to the Supply 510 voltage minus the forward diode drop of Diode 512. This will cause the switch SW 514 to turn on and the capacitive coupling between the signal this is desired to pass (e.g. Signal Source 516) will increase. If the input signal (as illustrated by Signal Source 516) goes lower than what it was previously (i.e. the input signal is falling e.g. heading toward Ground 518), the Diode 512 will hold the gate voltage (at G 508) at the same supply diode level (i.e. Supply 510 minus diode drop from Diode 512). If the input signal (as illustrated by Signal Source 516) is rising (goes higher than what it was previously—e.g. the input signal is heading away from Ground 518), the incremental voltage multiplied by $(C_{DG}+C_{SG}+C_{CG})/(C_{DG}+C_{SG}+C_{CG}+C_{GE})$ will be added to the gate voltage (G 508), increasing it and possibly increasing it above the Supply 510 voltage depending on the input signal.

One of skill in the art will appreciate that the embodiment as illustrated in FIG. 5 has a technical advantage as there is no power consumption from the power supply because there is no dynamic behavior added to the circuit other than the input signal itself.

One of skill in the art will appreciate that the embodiment as illustrated in FIG. 5 has a technical advantage as the parasitic capacitances associated with the switch transistor (in FIG. 5—SW 514) are reduced because both terminals (e.g. Source Node S 520 and Drain Node D 524) are seeing the same signal (e.g. Signal Source 516) (because SW 514 is in the conducting mode and S and D are at approximately the same potential). This reduction in capacitance assists in increasing the bandwidth that may be handled.

One of skill in the art will appreciate that the embodiment as illustrated in FIG. 5 has a technical advantage as the gate voltage (e.g. FIG. 5—G 508) self-adjusts as necessary based on the input signal. This self-adjusting does not require carefully prepared gate voltages to prevent any damage from happening.

Figure 6:
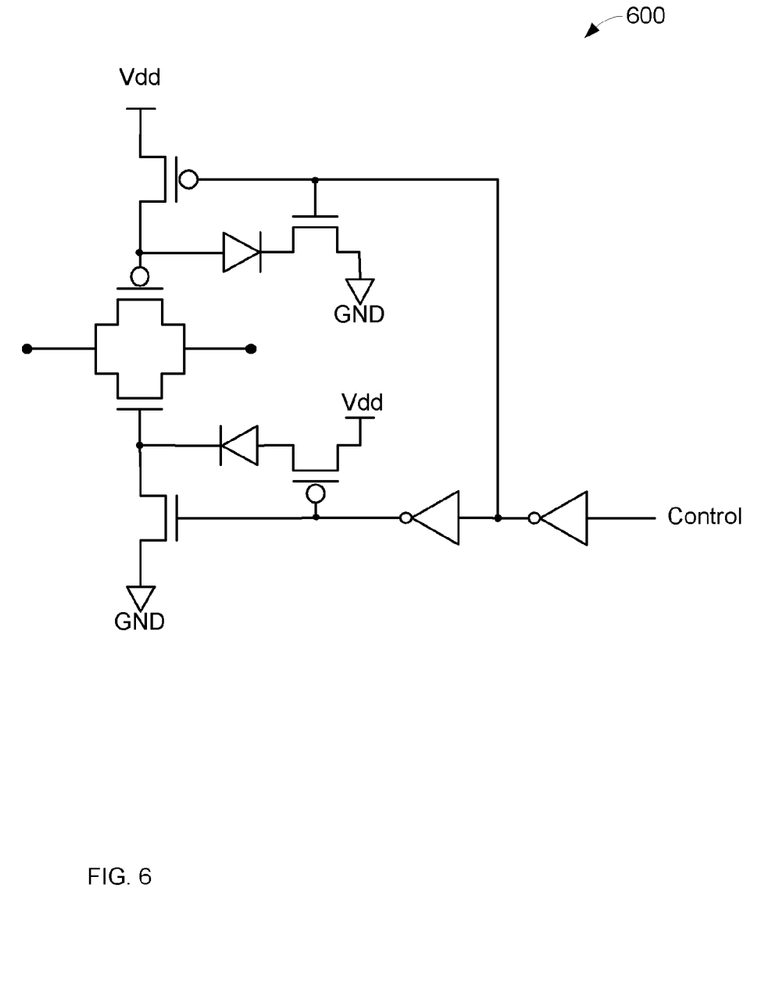
FIG. 6 illustrates one embodiment of the invention showing use of NMOS and PMOS in the switch.

While the above description (such as for FIG. 5) has detailed use of an NMOS switch transistor, the invention is not so limited and the technique may also be applied to PMOS. For example, FIG. 6 illustrates, generally at 600, one embodiment of the invention where the same technique disclosed above is applied also to a PMOS transistor in a complementary fashion. The result is a circuit which helps handling symmetrical signals. One of skill in the art will recognize that in the embodiment of the invention as illustrated in FIG. 6 that the PMOS pass transistor gate voltage may drop below GND based on a negative going (falling) input signal.

Figure 7:
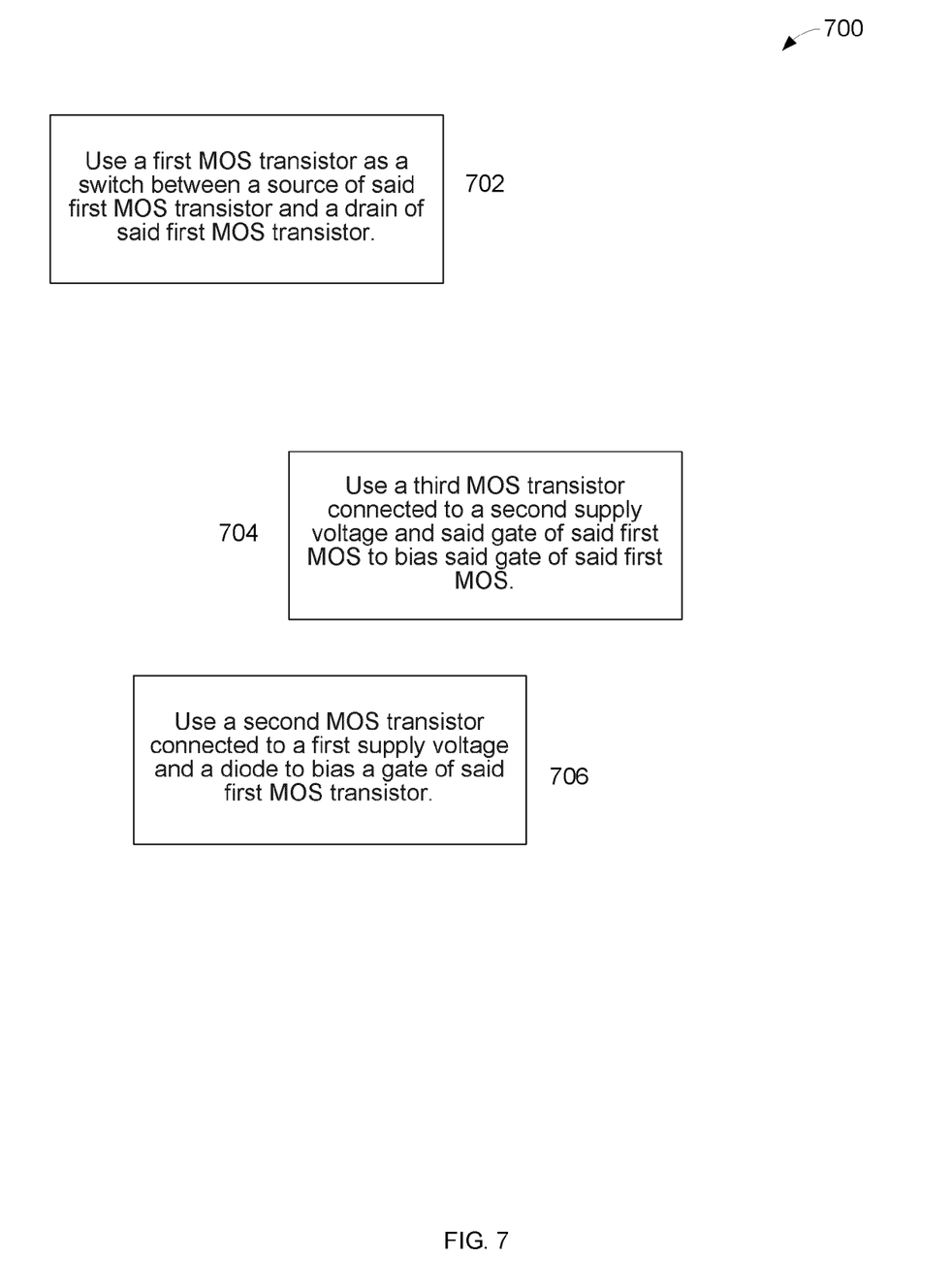
FIG. 7 illustrates one embodiment of the invention.

FIG. 7 illustrates, generally at 700, one embodiment of the invention. At 702 use a first MOS transistor as a switch between a source of said first MOS transistor and a drain of said first MOS transistor. At 704 use a third MOS transistor connected to a second supply voltage and said gate of said first MOS to bias said gate of said first MOS. At 706 use a second MOS transistor connected to a first supply voltage and a diode to bias a gate of said first MOS transistor.

While NMOS and PMOS have been used to illustrate the invention, the invention is not so limited and other transistor types may be used. For example, JFETs may be used instead of MOSFETS. In embodiments where NMOS has been illustrated PMOS may be used. Additionally, one of skill in the art will recognize that different gate diode-switch configurations may be used.

Thus a method and apparatus for self gate pumped NMOS high speed switch have been described.

Figure 1:
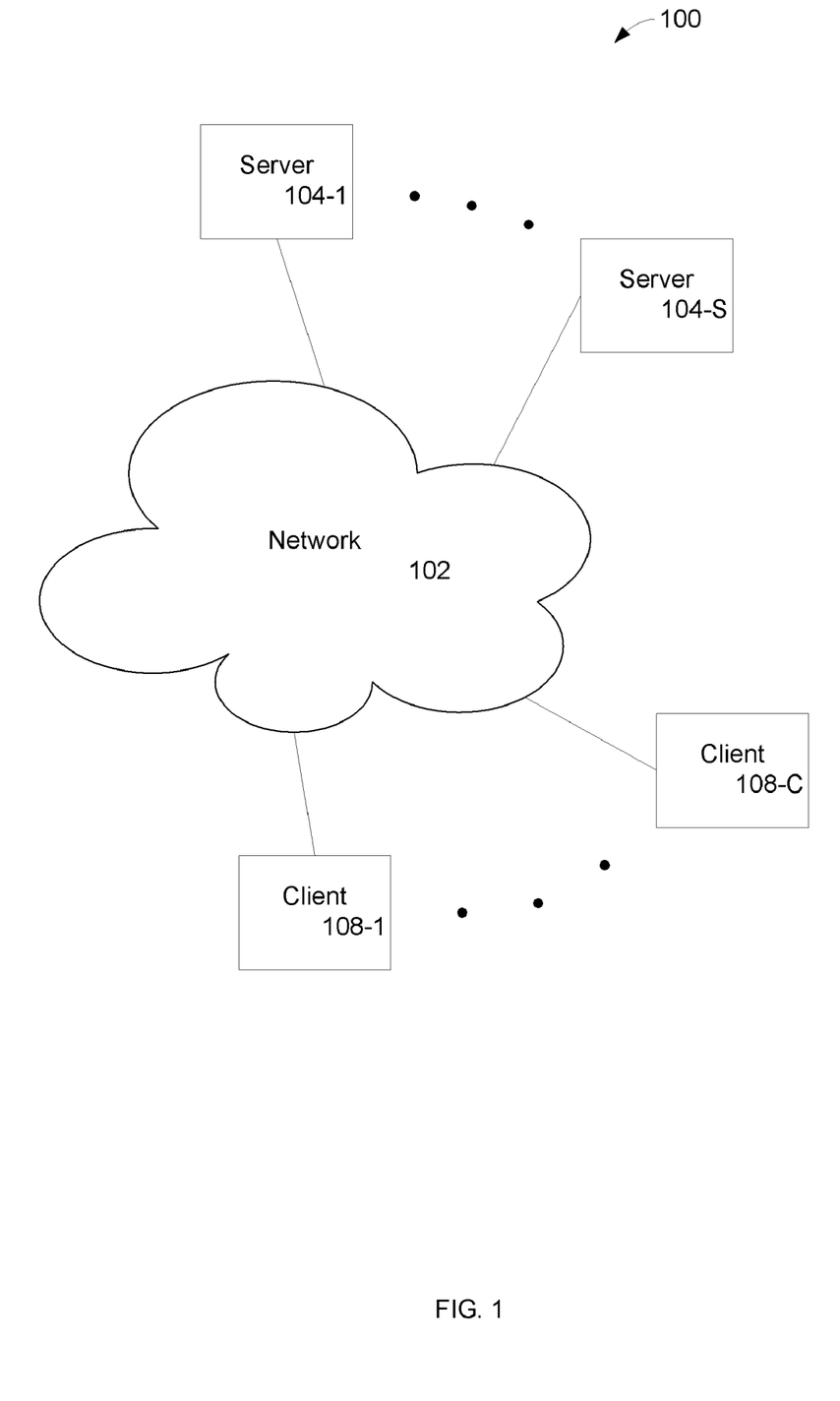
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
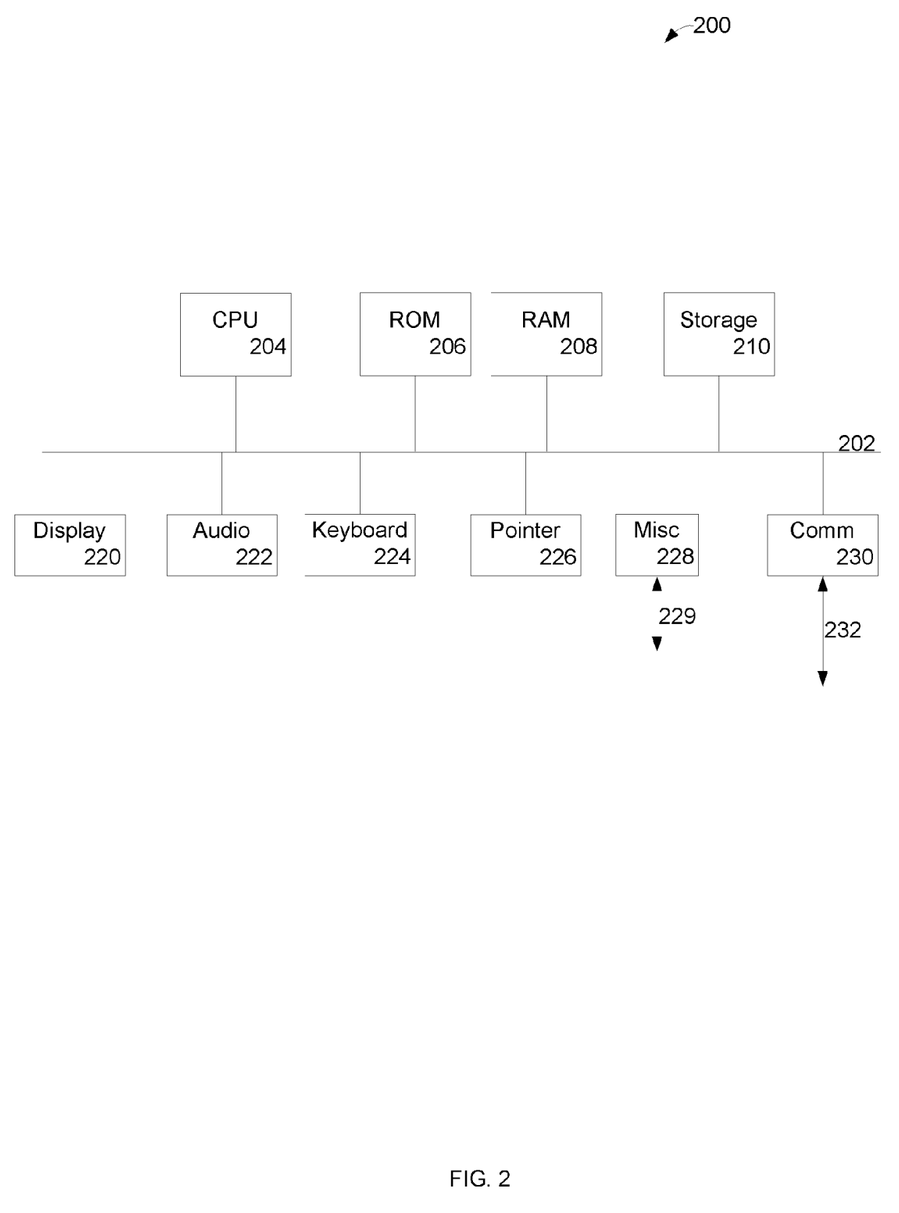
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very very close or similar. Since two physical entities can never be exactly equal, a phrase such as "substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for Self gate pumped NMOS high speed switch have been described.

What is claimed is:

1. An apparatus comprising:
    a first NMOS transistor having a gate, a source, and a drain, said source capable of being operatively coupled to an input, said drain capable of being operatively coupled to an output;
    a first diode having an anode and a cathode, said cathode operatively coupled to said first NMOS transistor gate;
    a first PMOS transistor having a gate, a source, and a drain, said source capable of being operatively coupled to a first supply voltage, said drain operatively coupled to said first diode anode;
    a second NMOS transistor having a gate, a source, and a drain, said drain capable of being operatively coupled to said first NMOS transistor gate, said source capable of being operatively coupled to a second supply voltage, and said gate operatively coupled to said first PMOS transistor gate;
    a second PMOS transistor having a gate, a source, and a drain, said source capable of being operatively coupled to said input, said drain capable of being operatively coupled to said output;
    a second diode having an anode and a cathode, said anode operatively coupled to said second PMOS transistor gate;
    a third NMOS transistor having a gate, a source, and a drain, said source capable of being operatively coupled to said second supply voltage, said drain operatively coupled to said second diode cathode; and
    a third PMOS transistor having a gate, a source, and a drain, said drain capable of being operatively coupled to said second PMOS transistor gate, said source capable of being operatively coupled to said first supply voltage, and said gate operatively coupled to said third NMOS transistor gate.

2. The apparatus of claim 1 further comprising:
    a first inverter having an input and an output; said input capable of being operatively coupled to a control input; and said output operatively coupled to said third PMOS gate;
    a second inverter having an input and an output, said input operatively coupled to said first inverter output, and said output operatively coupled to said second NMOS gate.

* * * * *